United States Patent [19]

Courant

[11] Patent Number: 5,615,571
[45] Date of Patent: Apr. 1, 1997

[54] DEVICE FOR CAMBERING CONDUCTIVE FINGERS ON AN INTEGRATED CIRCUIT

[75] Inventor: Patrick Courant, Viroflay, France

[73] Assignee: Bull, S.A., Louveciennes, France

[21] Appl. No.: 581,421

[22] Filed: Dec. 29, 1995

[30] Foreign Application Priority Data

Dec. 29, 1994 [FR] France .................... 94 15885

[51] Int. Cl.⁶ .................... B21F 45/00; H01R 43/00
[52] U.S. Cl. .................... 72/322; 72/457; 140/105; 29/827
[58] Field of Search ............... 72/457, 306, 316, 72/322; 140/105, 106, 147; 29/827

[56] References Cited

U.S. PATENT DOCUMENTS

| | | | |
|---|---|---|---|
| 5,065,504 | 11/1991 | Olla | 140/105 |
| 5,210,936 | 5/1993 | Simmons et al. | 140/105 |
| 5,358,017 | 10/1994 | Ide | 140/105 |

FOREIGN PATENT DOCUMENTS

| | | | |
|---|---|---|---|
| 4302203 | 6/1993 | Germany. | |
| 0183723 | 7/1988 | Japan | 140/105 |
| 9409510 | 8/1993 | WIPO. | |

*Primary Examiner*—David Jones
*Attorney, Agent, or Firm*—Kerkam, Stowell, Kondracki & Clarke, P.C.; Edward J. Kondracki

[57] ABSTRACT

A device for cambering conductive fingers, including a cambering plate (14) having a mold (16) which corresponds to the camber to be produced, a device for positioning (8) the intermediate substrate relative to the cambering plate (14), a cambering tool (22) disposed opposite the mold (16) for acting on a conductive finger (4), and a control device (24, 7) for ensuring or controlling the relative displacement of the cambering plate and the cambering tool in a first direction perpendicular to the plane containing the conductive fingers (4) and in a second direction parallel to the longitudinal direction of the conductive fingers (4).

7 Claims, 2 Drawing Sheets

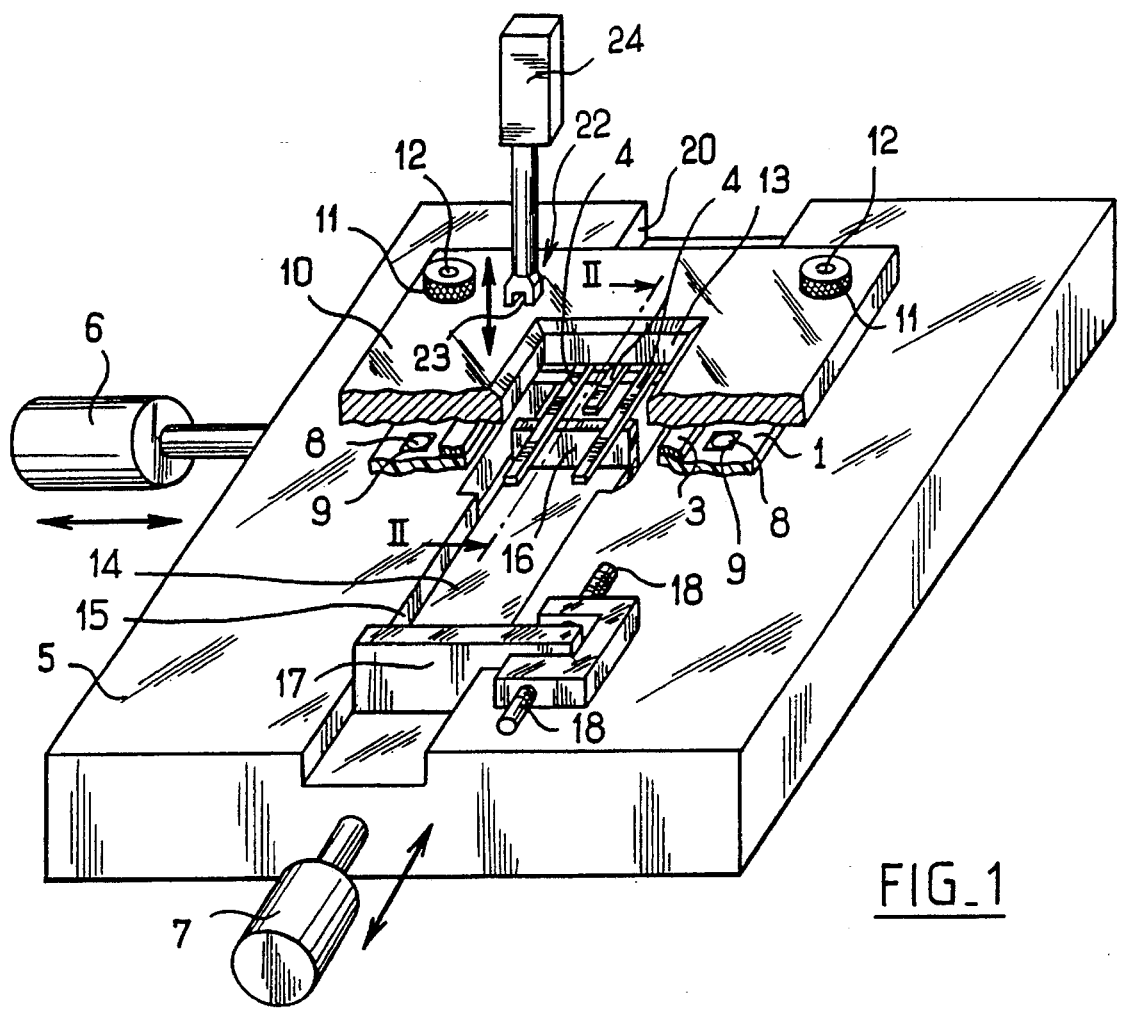
FIG_1
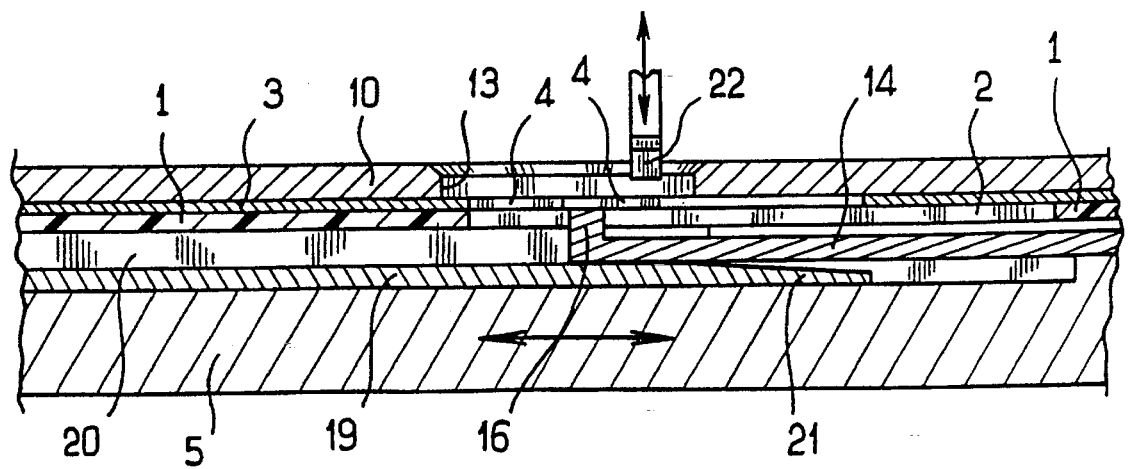
FIG_2

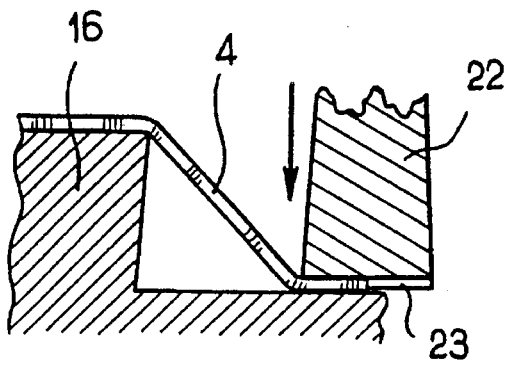
FIG_3
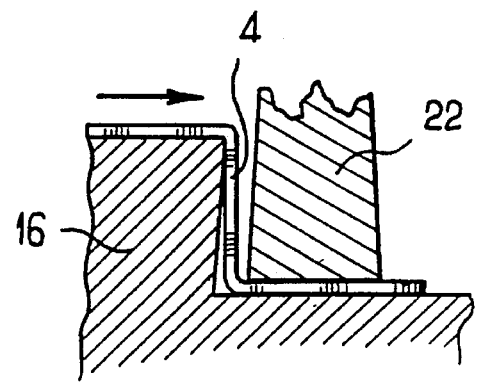
FIG_4
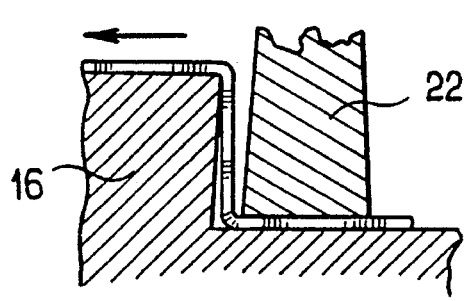
FIG_5
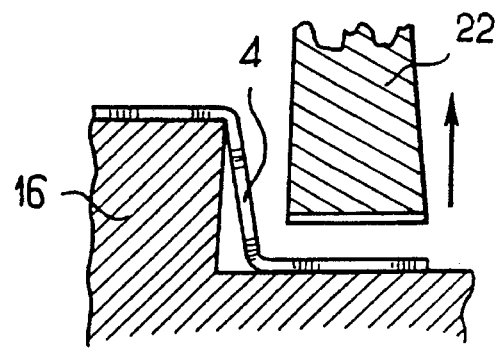
FIG_6

DEVICE FOR CAMBERING CONDUCTIVE FINGERS ON AN INTEGRATED CIRCUIT

FIELD OF THE INVENTION

The present invention relates to a device for cambering conductive fingers on an intermediate substrate of an integrated circuit.

BACKGROUND OF THE INVENTION

It is known that when assembling integrated circuits in order to incorporate them into an electronic circuit, the integrated circuits are generally mounted on an intermediate substrate formed by an insulating film into which an aperture for receiving the integrated circuit has been cut, which film has been laminated onto a conductive layer cut so as to form conductive connecting fingers which project into the aperture which receives the integrated circuit. The conductive fingers are generally produced by etching the conductive layer which has been laminated onto the film, so that once produced they extend in the plane of the conductive layer. The connection between the conductive fingers and the integrated circuit is achieved by spot welding the conductive fingers to the terminals of the integrated circuit.

Experience has shown that welding flat conductive fingers to the terminals of an integrated circuit runs the risk of a short-circuit on the edge of the integrated circuit, causing its destruction. Therefore, in order to avoid this short-circuit risk, conductive fingers have been produced which are cambered so as to produce a pinpoint contact between the ends of the conductive fingers and the terminals of the integrated circuit.

Known devices for cambering conductive fingers comprise a matrix having an edge which corresponds to a first fold line on the conductive fingers, and a punch having a dimension which is smaller than one dimension of the matrix which produces a second fold line on the conductive fingers when the intermediate substrate is disposed on the matrix and the punch is engaged inside it. The matrix and the punch must therefore have dimensions which are precisely adapted to the disposition of the conductive fingers on the intermediate substrate and to the disposition of the terminals on the integrated circuit, so that after the cambering of the conductive fingers, the ends of the conductive fingers coincide with the terminals of the integrated circuit. Therefore, it is not possible to use the same matrix and the associated punch in connection with different integrated circuits having terminals disposed in different configurations, especially since the terminals are generally distributed on different sides of the integrated circuit. Due to the fast that the matrix and the associated punch must be contracted with extreme precision, the cost thereof is very high and is therefore not compatible with their utilization in the laboratory, where prototypes of electronic circuits are generally constructed with various integrated circuits which are mounted on a board in very small numbers.

Moreover, the existing cambering devices do not ensure the cambering of conductive fingers which have unequal lengths or sinuous profiles designed to reach terminals disposed at various distances from the edge of the integrated circuit.

SUMMARY OF THE INVENTION

An object of the invention is to provide a device for cambering conductive fingers on an intermediate substrate of an integrated circuit which ensures the cambering of the conductive fingers when they are disposed in widely varying configurations.

In order to achieve this and other objects, the invention provides a device for cambering conductive fingers on an intermediate substrate of an integrated circuit, comprising a cambering plate which includes a mold corresponding to the camber to be produced, means for positioning the intermediate substrate relative to the cambering plate, a cambering tool disposed opposite the mold which acts on a conductive finger, and means for ensuring or controlling the relative displacement of the cambering plate and the cambering tool in a first direction perpendicular to the plane which contains the conductive fingers, and in a direction parallel to the longitudinal direction of the conductive fingers.

Thus, each conductive finger is applied to the mold in succession, and in the case of conductive fingers which have widely varying configurations, it is possible with the instant invention to adapt the position of the cambering plate relative to the conductive finger to be cambered prior to cambering it, and, therefore, to use a single device to camber the conductive fingers in their various configurations.

According to an preferred embodiment of the instant invention, the device includes means for ensuring controlling the relative displacement of the cambering tool and the cambering plate in a third direction perpendicular to the plane which includes the first and second directions. Thus, the cambering of several conductive fingers in succession is achieved without the changing the position of the intermediate substrate relative to the cambering plate.

According to another advantageous aspect of the invention, the cambering device includes a movable table to which the intermediate substrate is fastened, and the cambering plate is mounted on the movable table so that the cambering plate moves in a direction parallel to the longitudinal direction of the conductive fingers. Thus, without changing the position of the intermediate substrate, it is possible to camber the conductive fingers at various points on the fingers.

According to yet another advantageous aspect of the invention, the device includes an adjustment plate disposed underneath the cambering plate, which adjustment plate is preferably movable relative to the cambering plate in a direction parallel to the direction in which the cambering plate moves, and the adjustment plate has a bevelled end facing the cambering plate. Thus, the positioning of the cambering plate relative to the conductive fingers is precisely controlled, and in particular, the risk of damage to the conductive fingers when the cambering finger is in motion is avoided.

Other characteristics and advantages of the invention will become more apparent with a reading of the following description of a particular non-limiting embodiment of the invention relative to the appended figures, in which:

BRIEF DESCRIPTION OF THE DRAWINGS

FIG. 1 is a perspective and partially exploded view of the device according to the invention, FIG. 2 is an enlarged partial cutaway view along the line II—II in FIG. 1, FIG. 3 is a schematic representation of the cambering tool and the mold on the cambering plate during a first step in the operation of the device according to the invention, FIG. 4 is a view analogous to that in FIG. 3 during a second step in the operation of the device according to the invention, FIG. 5 is a view analogous to that in FIG. 3 during a third step in the operation of the device according to the invention, FIG. 6 is a view analogous to that in FIG. 3 during a fourth step in the operation of the device according to the invention.

DETAILED DESCRIPTION OF THE PREFERRED EMBODIMENTS

It will be noted that for better comprehension of the invention, the relative dimensions of the various parts shown in the drawings are not to scale, and that, in particular, the intermediate substrate and the conductive fingers have been represented as having a thickness which is proportionally far greater than their normal thickness relative to the other parts which constitute the device according to the invention.

Referring now to the figures, the device according to the invention is intended to be used in connection with an intermediate substrate for integrated circuits which, in a known way, includes an insulating film 1 in which an aperture 2 has been produced, and onto which a conductive layer 3 is laminated, for example a copper layer, on which conductive fingers 4 have been produced, for example by etching. The conductive fingers 4 project into the aperture 2. In the embodiment illustrated, the intermediate substrate has only three conductive fingers 4, a short central finger and two longer lateral fingers, although in reality the number of conductive fingers is considerably greater.

The device according to the invention includes a movable table 5 which extends in a horizontal plane and is mounted so as to slide in two directions, in a known way relative to a frame which is not represented. The movements of the movable table in these two directions is controlled by micrometer motors 6 and 7, respectively. On its upper surface, the movable table 5 includes positioning fingers 8 on which engage perforations 9 in the film 1 of the intermediate substrate. A holding plate 10 is applied to the intermediate substrate and is fastened to the movable table 5 by knurled bolts 11 screwed onto threaded rods 12 fastened to the movable table 5. The holding plate 10 includes an aperture 13 which allows access to the conductive fingers 4.

A cambering plate 14 is mounted so as to slide in a groove 15 in the movable table 5 in a direction parallel to the longitudinal direction of the conductive fingers 4. At one end, the cambering plate includes a mold 16 in the form of a stairstep at right angles to the longitudinal direction of the conductive fingers 4 in the embodiment illustrated. At the opposite end, the cambering plate 14 includes a control bar 17 whose position relative to the movable table 5 is adjusted by micrometer screws 18 fastened to the movable table 5.

The height adjustment of the mold 16 is controlled by an adjustment plate 19 which is disposed inside a groove 20 in the movable table 5 and which extends underneath the cambering plate 14. At its end facing the cambering plate, the adjustment plate 19 includes a bevelled part 21 turned toward the cambering plate 14.

A cambering tool 22 is disposed above the movable table 5 and plumb with the aperture 13 in the holding plate 10. The cambering tool 22 includes, on its lower surface turned toward the conductive fingers 4, a groove 23 which has a width slightly larger than the width of the conductive fingers 4 and a height slightly smaller than the thickness of the conductive fingers 4 (see FIG. 3). As illustrated in FIGS. 3 through 6, in the cross-section in the plane parallel to the longitudinal direction of the conductive fingers 4, the cambering tool 22 has a slightly trapezoid shape and the mold 16 has a surface which is roughly parallel to the opposing surface of the cambering tool 22. The cambering tool 22 is connected to an operating mechanism 24 which controls its vertical movement.

The operation of the device according to the invention is as follows: An intermediate substrate which includes the conductive fingers 4 is positioned on the movable table 5 and held in place by the holding plate 10, and the conductive fingers 4 are disposed so as to be accessible through the aperture 13 of the holding plate 10. The cambering plate 14 is released by sliding the adjustment plate 19 until the bevelled part 21 is plumb with the mold 16 in such a way that the upper surface of the mold 16 comes to a level slightly lower than the lower surface of the conductive fingers 4. The cambering plate 14 is then moved by means of micrometer screws 18 in order to position the mold 16 plumb with the longest conductive fingers 4, at a desired cambering distance from the ends of the conductive fingers 4. The adjustment plate 19 is then moved back underneath the cambering plate 14 so as to ensure the height of its position. The adjustment plate 19 is preferably locked into this position by locking screws not shown. The movable table 5 is then moved so that the cambering tool 22 is plumb with one of the conductive fingers to be cambered, while being slightly offset from the mold 16 as illustrated in FIG. 2. The cambering tool 22 is then lowered and it produces a first deformation of the conductive finger 4 in a first direction perpendicular to the plane which contains the conductive plates 4, as illustrated in FIG. 3. The micrometer motor 7 is actuated in order to move the movable table 5 in a direction parallel to the longitudinal direction of the conductive fingers 4, thus bringing the cambering tool 22 closer to the mold 16 as illustrated in FIG. 4. This step makes it possible to compensate for the elasticity of the material and deforms the conductive finger 4 in the exact shape of the cambering finger. During this movement, in which then end of the conductive finger 4 would have a tendency to move out of alignment relative to the longitudinal direction of the conductive finger 4, the conductive finger is held in place by the sides of the groove 23 of the cambering tool 22 and, therefore, remains precisely positioned in the desired direction. The micrometer motor 7 is then operated in reverse in order to move the mold 16 away from the cambering tool 22 as illustrated in FIG. 5, then the cambering tool is raised, and the conductive finger 4 retains a cambered form as illustrated in FIG. 6.

Once the cambering tool 22 has been raised, the micrometer motor 6 is actuated in order to move the moveable table 5 so as to make the second long conductive finger plumb with the cambering tool 22 and the cambering operation is repeated as explained above in reference to FIGS. 3 through 6. The cambering plate 14 is then released and moved so as to bring the mold 16 into the desired position for cambering the central finger 4, which is shorter than the two lateral fingers. It will be noted that during this movement, the displacement of the mold 16 does not interfere with the conductive fingers which are already cambered, so that the cambering of the central finger can be produced as before by means of the cambering tool 22.

It is understood that the invention is not limited to the embodiment described, and it is possible to make various changes and modifications without going outside the scope of the invention as defined by the appended claims.

In particular, it is possible to connect the cambering plate 14 to a micrometer motor which allows the automation of not only the cambering operations themselves, but of all the movements of the device, as a function of the pre-established geometric configuration of the conductive fingers on a given intermediate substrate.

In the case of an intermediate substrate which includes conductive fingers which extend from the four corners of the aperture 2, it would also be possible to provide two cambering plates running in perpendicular directions, with each cambering plate being connected to a control mechanism and having a mold which makes it possible to successively camber the conductive fingers extending from two sides of the aperture 2 in the intermediate substrate. It will also be noted that the device according to the invention makes it possible to produce a camber along an oblique line by using an appropriate mold and cambering tool.

The device according to the invention can not only be used in the laboratory because of the ease in which it can be adapted to various integrated circuits and to the corresponding intermediate substrates, but can also be used in a production line due to the considerable ease of automation of this device.

While the preferred forms and embodiments have been illustrated and described, it will be apparent to those of ordinary skill in the art that various changes and modifications may be made without deviating from the inventive concepts and true spirit of the invention, and it is intended by the appended claims to define all such concepts which come within the full scope and true spirit of the invention.

I claim:

1. A device for cambering at least one conductive finger (4) in an intermediate substrate of an integrated circuit, comprising a cambering plate (14) which includes a mold (16) which corresponds to a camber to be produced, means for positioning (8) the intermediate substrate relative to the cambering plate (14), a cambering tool (22) disposed opposite the mold (16) for acting on said at least one conductive finger (4), and means (24, 7) for controlling a relative displacement of the cambering plate and the cambering tool in a first direction perpendicular to a plane containing said at least one conductive finger (4) and in a second direction parallel to a longitudinal direction of said at least one conductive finger (4), said device further including a movable table (5) to which said intermediate substrate is fastened, said cambering plate (14) being mounted on the movable table (5) in a manner which enables movement in a direction parallel to said longitudinal direction of the at least one conductive finger (4).

2. The device according to claim 1, further including means (6) for controlling a relative displacement of the cambering tool (22) and the cambering plate (14) in a third direction which is perpendicular to a plane which includes said first and said second direction.

3. The device according to claim 1, further including an adjustment plate (19) disposed underneath the cambering plate (14).

4. The device according to claim 3, wherein said adjustment plate (19) is movable relative to the cambering plate (14) in a direction which is parallel to a direction of displacement of the cambering plate.

5. The device according to claim 4, wherein said adjustment plate has a bevelled end (21) facing the cambering plate (14).

6. The device according to claim 1, wherein said cambering tool has a surface turned toward the at least one conductive finger (4), said surface including a groove (23) which has a width roughly equal to a width of at least one conductive finger (4).

7. The device according to claim 1, wherein said cambering tool (22) has a trapezoidal profile and the mold (16) includes a surface which is parallel to an opposing surface of the cambering tool (22).

\* \* \* \* \*